United States Patent [19]
Baba

[11] Patent Number: 5,589,696
[45] Date of Patent: Dec. 31, 1996

[54] TUNNEL TRANSISTOR COMPRISING A SEMICONDUCTOR FILM BETWEEN GATE AND SOURCE/DRAIN

[75] Inventor: Toshio Baba, Tokyo, Japan

[73] Assignee: NEC Corporation, Tokyo, Japan

[21] Appl. No.: 960,863

[22] Filed: Oct. 14, 1992

[30] Foreign Application Priority Data

Oct. 15, 1991 [JP] Japan ................................. 3-265749

[51] Int. Cl.⁶ .................... H01L 29/06; H01L 29/861; H01L 29/866
[52] U.S. Cl. .................... 257/105; 257/25; 257/30; 257/35; 257/104; 257/106
[58] Field of Search ................................. 257/30, 35, 39, 257/31, 9, 25, 104, 105, 106

[56] References Cited

U.S. PATENT DOCUMENTS

| | | | |
|---|---|---|---|
| 3,390,352 | 6/1968 | Kleinknecht | 257/105 |
| 4,884,111 | 11/1989 | Nishino et al. | 357/5 |
| 4,935,804 | 6/1990 | Ito et al. | 357/71 |
| 4,969,019 | 11/1990 | Banerjee . | |
| 5,105,247 | 4/1992 | Cavanaugh | 257/105 |
| 5,236,896 | 8/1993 | Nakamura et al. | 257/39 |

FOREIGN PATENT DOCUMENTS

| | | |
|---|---|---|
| 3250855 | 10/1988 | Japan . |
| 2268429 | 4/1989 | Japan . |
| 5235057 | 9/1993 | Japan . |

OTHER PUBLICATIONS

IEEE Electron Device Letters, vol. EDL8, No. 8, Aug. 1987, pp. 347–349, S. Banerjee et al, A New Three–Terminal Tunnel Device.

S. Banerjee et al., "A New Three-Terminal Tunnel Device", IEEE Electron Device Letters, vol. EDL–8, No. 8, Aug. 1987, pp. 347–349.

*Primary Examiner*—Sara W. Crane
*Assistant Examiner*—Valencia M. Wallace
*Attorney, Agent, or Firm*—Sughrue, Mion, Zinn, Macpeak & Seas

[57] ABSTRACT

A tunnel transistor comprises a semiconductor film (27) between a gate isolating film (17) and parts of first (13) and second (15) semiconductor layers which are formed in a substrate (11) to serve as source and drain regions with a spacer region left therebetween and covered with the semiconductor film. The gate isolating film is over the part of the first semiconductor layer and is made of either an insulating material or a semiconductor material, each of which materials should have a wider forbidden bandwidth than a semiconductor material of the semiconductor film, such as silicon dioxide, silicon nitride, or aluminium nitride, or gallium phosphide for silicon, or AlGaAs fox gallium arsenide. A source electrode is formed on an uncovered area of the first semiconductor layer. The semiconductor film forms a tunnel junction with the first semiconductor layer and an ohmic junction with the second semiconductor layer, which junction may be either a homojunction or a heterojunction. The transistor can be of a submicron order and is operable as either of depletion and enhancement types of producing a great drain current at a high speed when supplied with no netavite gate voltage and with a gate voltage.

15 Claims, 1 Drawing Sheet

TUNNEL TRANSISTOR COMPRISING A SEMICONDUCTOR FILM BETWEEN GATE AND SOURCE/DRAIN

BACKGROUND OF THE INVENTION

This invention relates to a tunnel transistor.

A tunnel transistor is described, for example, in a letter contributed by Sanjay Banerjee and three others to the IEEE Electron Device Letters, Volume EDL-8, No. 8 (August 1987), pages 347 to 349, under the title of "A New Three-Terminal Tunnel Device". In the tunnel transistor according to Banerjee et al, positive use is made of a tunnel effect which gives rise to problems when MOS (metal-oxide-semiconductor) FET's (field effect transistors) are scaled down to a submicron order. It is therefore possible to implement such tunnel transistors as a highly integrated semiconductor circuit.

In the manner which will later be described a little more in detail, the Banerjee et al tunnel transistor comprises a semiconductor substrate having a principal surface and doped with an impurity of a first conductivity type to a relatively lower concentration. First and second degenerate semiconductor layers are formed contiguous to the principal surface with a spacer region left therebetween in the substrate. The first (degenerate) semiconductor layer is doped with an impurity of the first conductivity type to a higher concentration. The second (degenerate) semiconductor layer is doped with an impurity of a second conductivity type opposite to the first conductivity type to the higher concentration. An insulating film is formed on the principal surface to cover the first semiconductor layer and the spacer region and partly the second semiconductor layer, leaving a major portion of the second semiconductor layer uncovered. The principal surface is left exposed around the insulating film as an exposed surface. A source electrode is formed on the exposed surface adjacent to the first semiconductor layer. A drain electrode is formed on the major portion of the second semiconductor layer. A gate electrode is formed on the insulating film. For the reason which will become clear later in the description, the insulating film is herein called a gate isolating or spacing film.

Although effective in highly integrating such tunnel transistors, the Banerjee et al tunnel transistor can still be improved to provide a larger tunnelling current. Furthermore, it is possible to give a higher speed to operation of the tunnel transistor.

SUMMARY OF THE INVENTION:

It is consequently an object of the present invention to provide a tunnel transistor which can be scaled down to a submicron order.

It is another object of this invention to provide a tunnel transistor which is of the type described and by which it is possible to attain a large tunnelling current.

It is still another object of this invention to provide a tunnel transistor which is of the type described and which is operable at a high speed.

Other objects of this invention will become clear as the description proceeds.

On setting forth the gist of this invention, it is possible to understand that a tunnel transistor includes a semiconductor substrate having a principal surface and doped with an impurity of a first conductivity type to a relatively lower concentration and degenerate first and second semiconductor layers formed contiguous to the principal surface with a spacer region left therebetween and doped with an impurity of the first conductivity type and with an impurity of a second conductivity type, respectively, to a higher concentration.

According to this invention, the above-understood tunnel transistor comprises: (A) a degenerate third semiconductor layer formed on the principal surface and doped with an impurity of the second conductivity type to cover the spacer region and first and second parts of the first and the second semiconductor layers and to leave third and fourth parts of the first and the second semiconductor layers uncovered (B) a gate isolating film formed on the third semiconductor layer over the first part of the first semiconductor layer and having a wider forbidden bandwidth than the third semiconductor layer; (C) an electrode on the gate isolating film; and (D) a pair of electrodes forming ohmic junctions with the third and the fourth parts of the first and the second semiconductor layers.

DESCRIPTION OF THE PREFERRED EMBODIMENT

Figure 1:
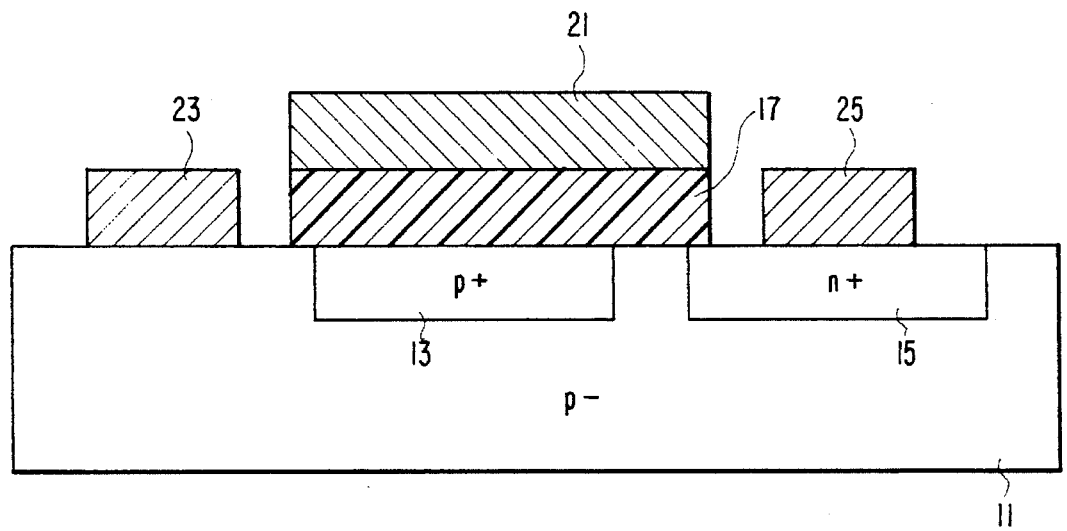
FIG. 1 schematically shows in vertical section a conventional tunnel transistor.

Referring to FIG. 1, a conventional tunnel transistor will first be described in order to facilitate an understanding of the present invention. The conventional tunnel transistor is of the type illustrated in the Banerjee et al letter referred to hereinabove.

Contiguous to a principal surface of a semiconductor substrate 11, first and second degenerate semiconductor layers 13 and 15 are formed in the substrate 11. It will be presumed that the substrate 11 is made of silicon doped with a p-type impurity to a relatively lower impurity concentration of $1 \times 10^{15}$ per cubic centimeter and that the first and the second (degenerate) semiconductor layers 13 and 15 are made also of silicon. In this event, the first semiconductor layer 13 is doped with the p-type impurity to a higher (impurity) concentration of $5 \times 10^{17}$ per cubic centimeter to serve as a source region. The second semiconductor layer 15 is doped with an n-type impurity to the higher concentration to serve as a drain region. A portion of the substrate 11 is left between the first and the second semiconductor layers 13 and 15 as a spacer region having a length of 0.5 to 90 microns between the first and the second semiconductor layers 13 and 15. It is possible to make the spacer region have a shorter length of 0.1 micron.

An insulating film 17 of silicon dioxide is formed on the principal surface to a thickness of from 5 to 30 nanometers to cover the first semiconductor layer 13 and the spacer region and partly the second semiconductor layer 15, thereby providing a gate-drain overlapping region of a length of from 0.5 to 90 microns along the principal surface and leaving a remaining portion of the second semiconductor layer 15 uncovered. The insulating film 17 serves as a gate oxide film. Around the gate oxide film 17, the principal surface is left exposed as an exposed surface.

A gate electrode 21 of polysilicon is formed on the gate oxide film 17 to lie over the first semiconductor layer 13, the spacer region, and the gate-drain overlapping region. The polysilicon is doped with the n-type impurity to the higher concentration. Source and drain electrodes 23 and 25 are formed of aluminium in ohmic contact with the substrate 11 at the exposed surface adjacent to the first semiconductor layer 13 and with the remaining portion of the second semiconductor layer 15.

In operation, it will first be assumed that the gate and the source electrodes 21 and 23 are grounded with the drain electrode 25 given a positive voltage. Under the circumstances, a combination of the source and the drain regions serve as a $p^--n^+$ diode supplied with a reversed bias voltage. As a consequence, no drain current is obtained at the drain electrode 25.

It will now be assumed that the gate electrode 21 is supplied with a sufficiently high positive voltage, such as about 10 volts, as a gate voltage. In this event, an inversion layer appears in the spacer region below the gate oxide film 17. The inversion layer will herein be called a spacer inversion layer, in which electrons are induced.

Another inversion layer appears along a surface which the first semiconductor layer 13 has contiguous to the gate oxide film 17. This inversion layer will be called a surface inversion layer. Doped to a high impurity concentration, the surface inversion layer is subjected to a high electric field, such as 1 MV/cm. This high electric field gives rise to tunnelling electrons which flow from the valence band of the first semiconductor layer 13 to the conduction band of the surface inversion layer.

The tunnelling electrons flow as a tunnelling current through the spacer inversion layer towards the second semiconductor layer 15 with electrons supplied from the source electrode 23 through the substrate 11 to the valence band of the first semiconductor layer 13. As a result, the drain current flows to put the tunnel transistor in transistor operation.

In the manner described in the foregoing, the transistor operation is achieved with the conventional tunnel transistor by controlling the tunnelling current which flows from the highly doped source region to the surface inversion layer. It is therefore impossible to raise the impurity concentration of the first semiconductor layer 13 and to give a high carrier density to the surface inversion layer The carrier density is at most $1 \times 10^{19}$ per cubic centimeter. This makes it impossible to get a great tunnelling current. In addition, the tunnel transistor has an equivalent circuit in which a tunnel junction is connected in series with a parasitic metal-oxide-semiconductor field effect transistor. This gives rise to a problem such that a high-speed operation is impossible.

Figure 2:
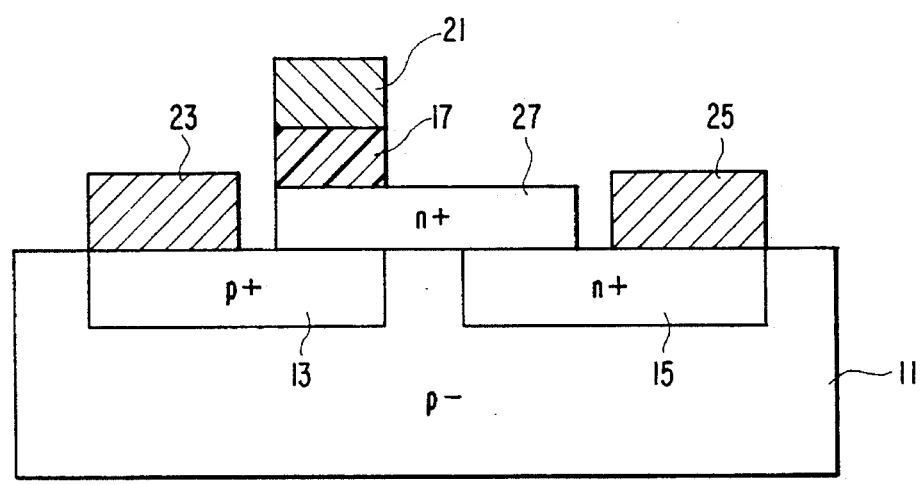
FIG. 2 is a schematic vertical sectional view of a tunnel transistor according to an embodiment of the instant invention.

Referring now to FIG. 2, the description will proceed to a tunnel transistor according to a preferred embodiment of this invention. The tunnel transistor comprises similar parts which are designated by like reference numerals and are similarly operable unless otherwise specified in the following.

In FIG. 2, the tunnel transistor comprises a third degenerate semiconductor layer 27 formed on the principal surface of the semiconductor substrate 11 and doped with the n-type impurity to the higher concentration. The third (degenerate) semiconductor layer 27 covers the spacer region and first and second parts of the first and the second semiconductor layers 13 and 15 to leave third and fourth parts of the first and the second semiconductor layers 13 and 15 uncovered. The third and the fourth parts are remaining portions of the first and the second semiconductor layers 13 and 15 other than the first and the second parts, respectively.

The insulating or the gate oxide film 17 is now formed on the third semiconductor layer 27 over the first part of the first semiconductor layer 13. The gate oxide film 17 has a wider forbidden bandwidth than the third semiconductor layer 27 and than the first and the second semiconductor layers 13 and 15. The gate electrode 21 is formed on the gate oxide film 17. The drain electrode 25 is formed on the fourth part of the second semicomductor layer 15 to form an ohmic junction with the second semiconductor layer 15.

In contrast to the tunnel transistor illustrated with reference to FIG. 1, the tunnel transistor of FIG. 2 has no gate-drain overlapping region. In addition, the source electrode 23 is formed on the third part of the first semiconductor layer 13 to form another ohmic junction with the first semiconductor layer 13. Formation of the source electrode 23 on the first semiconductor layer 13 allows the tunnel transistors of FIG. 2 more highly integrated than those illustrated with reference to FIG. 1.

The illustrated tunnel transistor was manufactured as follows. The semiconductor substrate 11 was made of silicon doped with boron to the relatively lower impurity concentration which is not higher than $1 \times 10^{15}$ per cubic centimeter. The first semiconductor layer 13 was formed by boron ion implantation into the substrate 11 to a predetermined depth and to the higher concentration in the manner known in the art. Similarly, the second semiconductor layer 15 was formed by arsenic ion implantation to the predetermined depth and to the higher concentration. It is desirable that the length of the spacer region should be sufficient to prevent a tunnelling current from flowing between the first and the second semiconductor layers 13 and 15. The length should therefore be 10 nanometers or more.

The third semiconductor layer 27 was grown on the principal surface to an initial thickness of 10 nanometers by molecular beam epitaxy (MBE) of silicon doped with arsenic to an impurity concentration of $3 \times 10^{19}$ per cubic centimeter. The gate oxide film 17 was formed by thermal surface oxidation of the third semiconductor layer 27 to a film thickness of 10 nanometers in the known manner. After formation of the gate oxide film 17, the third semiconductor layer 27 had a layer thickness of 6 nanometers between the gate oxide film 17 and the first part of the first semiconductor layer 13. The third semiconductor layer 27 is therefore referred to alternatively as a semiconductor film. After the gate electrode 21 was formed of n-type polysilicon, aluminium was evaporated to provide the source and the drain electrodes 23 and 25.

The first and the second semiconductor layers 13 and 15 should have an impurity concentration which allows formation of the ohmic junctions with the source and the drain electrodes 23 and 25. It is therefore desirable that each of the first and the second semiconductor layers 13 and 15 has a higher impurity concentration than the third semiconductor layer 27, such as $5 \times 10^{17}$ per cubic centimeter or more.

The predetermined depth should be as thin as possible. In practice, each of the first and the second semiconductor layers 13 and 15 was formed to a depth which was not greater than 100 nanometers. Each of the first and the second parts of the first and the second semiconductor layers 13 and 15 should have a length determined in consideration of an electric current which should be obtained from the tunnel transistor. In practice, the length should be substantially equal to the length of the spacer region in order to achieve a high degree of integration. Each of the first and the second semiconductor layers 13 and 15 should have a width which is similar to that used in an ordinary field effect transistor.

In operation, it will first be assumed as before that the gate and the source electrodes 21 and 23 are grounded and that the drain electrode 25 is given a positive voltage of from 0.1 to 1.0 volt. No current flows through the spacer region in the manner described in conjunction with FIG. 1. The third semiconductor layer 27, however, forms a $p^+$-$n^+$ tunnel junction relative to the first semiconductor layer 13 and an $n^+$-$n^+$ ohmic junction with the second semiconductor layer 15. As a consequence, a great drain current flows between the source and the drain electrodes 23 and 25 through the junctions.

It will now be assumed that the gate electrode 21 is given a negative gate voltage of an absolute value of from 0.1 to 0.3 volt. In such an event, electrons are driven away from a surface portion which the third semiconductor layer 27 has in contact with the gate oxide film 17. Therefore, the tunnel transistor is of a depletion type wherein a depletion layer grows from the surface portion.

When the negative gate voltage is increased in the absolute value to 0.5 volt, the depletion layer merges into another depletion layer which extends from the tunnel junction. This reduces an overlap of the valence band of the first semiconductor layer 13 with the conduction band of the third semiconductor layer 27 to reduce the tunnelling current which flows from the first semiconductor layer 13 to the third semiconductor layer 27. When the negative gate voltage is very high in the absolute value, such as 1 volt, the tunnelling current no more flows. The drain current is therefore rendered zero.

It should be noted in connection with the conventional tunnel transistor that the gate voltage controls an electric potential at an interface between the first semiconductor layer 13 and the gate oxide film 17. In contrast, the gate voltage does not control the electric potential at the tunnel junction in the tunnel transistor being illustrated. It is therefore possible to give a theoretically unlimitedly high carrier density to the first semiconductor layer 13. The high carrier density is, for example, $5 \times 10^{19}$ per cubic centimeter. The tunnelling current grows exponentially with the carrier density. The tunnelling current is therefore about three digits greater than that achieved with the conventional tunnel transister.

Furthermore, the third semiconductor layer 27 spans the first and the second semiconductor layers 13 and 15. The great tunnelling current can therefore flow between the first and the second semiconductor layers 13 and 15 with no hindrance.

In addition, the illustrated tunnel transistor comprises no parasitic metal-oxide-semiconductor field effect transistor. The tunnel transistor is therefore operable at a high speed.

Further in addition, it is possible to put the tunnel transistor into operation with the drain electrode 15 given a negative voltage relative to the source electrode 23 provided that the negative voltage is below a build-up voltage of the tunnel transistor. In such an event, control is carried out on a differential negative resistance which is characteristic to a tunnel or Esaki diode. The tunnel transistor is consequently operable as a multifunctional element.

In FIG. 2, the tunnel transistor may be of an enhancement type rather than the depletion type in the manner described in the foregoing. When the tunnel transistor is of the enhancement type, the drain current does not flow while the gate electrode 21 is grounded. The drain current begins to flow when the gate voltage is supplied. It should, however, be noted In this event that the third semiconductor layer 27 should be given a thinner layer thickness between the gate oxide film 17 and the first part of the first semiconductor layer 13 than that used in the tunnel transistor of the depletion type. The layer thickness should be such that no carrier is present in the third semiconductor layer 27 put in thermal equilibrium. The thinner layer thickness may be 4 nanometers when the impurity concentration is $3 \times 10^{19}$ per cubic centimeter in the third semiconductor layer 27.

While this invention has thus far been described in specific conjunction with a single embodiment thereof and in connection with a few manners of putting the tunnel transistor into operation, it will now be readily possible for one skilled in the art to put this invention into effect in various other manners. For example, the semiconductor material can be any one of germanium, gallium arsenide, indium phosphide, gallium antimonide, indium arsenide, InGaAs, and other known semicunductor materials. The first through the third semiconductor layers 13, 15, and 27 may not form homojunctions but may form heterojunctions. The n-type impurity can be any one of known impurities other than boron. Likewise, the p-type impurity can be any one of known impurities other than arsenic.

The insulating film 17 can be made of any one of other insulating materials provided that the insulating material has a wider forbidden bandwidth than the semiconductor material of the third semiconductor layer 27 and than the semiconductor material or materials of the first and the second semiconductor layers 13 and 15. For example, the insulating material may be silicon nitride ($Si_3N_4$) or aluminium nitride (AlN). The "insulating" material can be a semiconductor material having a wider forbidden bandwidth than the semiconductor material of the third semiconductor layer 27 and than the semiconductor material or materials of the first and the second semiconductor layers 13 and 15. For example, the "insulating" material may be gallium phosphide and AlGaAs when the first through the third semiconductor layers 13, 15, and 27 are made of silicon and of gallium arsenide, respectively. As a consequence, the insulating or the gate oxide film 17 is alternatively referred to herein as a gate isolating or spacing film.

What is claimed is:

1. A tunnel transistor including a semiconductor substrate having a principal surface and doped with an impurity of a first conductivity type to a first concentration and degenerate first and second semiconductor layers formed contiguous to said principal surface with a spacer region left therebetween and doped with an impurity of said first conductivity type and a second conductivity type, respectively, to a concentration higher than said first concentration, said tunnel transistor comprising:

a degenerate third semiconductor layer formed on top of said principal surface and doped with an impurity of said second conductivity type to cover said spacer region and first and second parts of said first and said second semiconductor layers, respectively, while leaving third and fourth parts of said first and said second semiconductor layers uncovered;

a gate isolating film formed on said third semiconductor layer over said first part of the first semiconductor layer and having a wider forbidden bandwidth than said third semiconductor layer;

a gate electrode on said gate isolating film; and a pair of electrodes forming ohmic junctions with said third and said fourth parts of the first and the second semiconductor layers.

2. A tunnel transistor as claimed in claim 1, said third semiconductor layer being made of a semiconductor material doped with the impurity of said second conductivity type, wherein said gate isolating film is made of an insulating material having a wider forbidden bandwidth than said semiconductor material.

3. A tunnel transistor as claimed in claim 2, said semiconductor material being selected from silicon, germanium, gallium arsenide, indium phosphide, gallium antimonide, indium arsenide, and InGaAs, wherein said insulating metarial is selected from silicon dioxide, silicon nitride, and aluminium nitride.

4. A tunnel transistor as claimed in claim 2, wherein said third semiconductor layer is doped with the impurity of said second conductivity type at least to said higher concentration.

5. A tunnel transistor as claimed in claim 4, wherein said third semiconductor layer forms a tunnel homojunction with said first part of the first semiconductor layer and an ohmic homojunction with said second part of the second semiconductor layer.

6. A tunnel transistor is claimed in claim 4, wherein said third semiconductor layer forms a tunnel homojunction with said first part of the first semiconductor layer and an ohmic heterojunction with said second part of the second semiconductor layer.

7. A tunnel transistor is claimed in claim 4, wherein said third semiconductor layer forms a tunnel heterojunction with said first part of the first semiconductor layer and an ohmic homojunction with said second part of the second semiconductor layer.

8. A tunnel transistor as claimed in claim 4, wherein said third semiconductor layer forms a tunnel heterojunction with said first part of the first semiconductor layer and an ohmic heretojunction with said second part of the second semiconductor layer.

9. A tunnel transistor as claimed in claim 1, said third semiconductor layer being made of a first semiconductor material doped with the impurity of said second conductivity type, wherein said gate isolating film is made of a second semiconductor material having a wider forbidden bandwidth than said first semiconductor material.

10. A tunnel transistor as claimed in claim 9, said first semiconductor material being selected from silicon and gallium arsenide, wherein said second semiconductor material is gallium phosphide and AlGaAs when said first semiconductor material is silicon and gallium arsenide, respectively.

11. A tunnel transistor as claimed in claim 9, wherein said third semiconductor layer is doped with the impurity of said second conductivity type at least to said higher concentration.

12. A tunnel transistor as claimed in claim 11, wherein said third semiconductor layer forms a tunnel homojunction with said first part of the first semiconductor layer and an ohmic homojunction with said second part of the second semiconductor layer.

13. A tunnel transistor as claimed in claim 11, wherein said third semiconductor layer forms a tunnel homojunction with said first part of the first semiconductor layer and an ohmic heterojunction with said second part of the second semiconductor layer.

14. A tunnel transistor as claimed in claim 11, wherein said third semiconductor layer forms a tunnel heterojunction with said first part of the first semiconductor layer and an ohmic homojunciton with said second part of the second semiconductor layer.

15. A tunnel transistor as claimed in claim 11, wherein said third semiconductor layer forms a tunnel heterojunction with said first part of the first semiconductor layer and an ohmic heterojunction with said second part of the second semiconductor layer.

* * * * *